(12) United States Patent
Hammes et al.

(10) Patent No.: US 7,349,516 B2
(45) Date of Patent: Mar. 25, 2008

(54) METHOD FOR TRIMMING A TWO-POINT MODULATOR, AND A TWO-POINT MODULATOR HAVING A TRIMMING APPARATUS

(75) Inventors: Markus Hammes, Dinslaken (DE); Guiseppe Li Puma, Bochum (DE); Stefan Van Waasen, Sollentuna (SE)

(73) Assignee: Infineon Technologies AG, Munich (DE)

( * ) Notice: Subject to any disclaimer, the term of this patent is extended or adjusted under 35 U.S.C. 154(b) by 630 days.

(21) Appl. No.: 10/923,351

(22) Filed: Aug. 20, 2004

(65) Prior Publication Data
US 2005/0084034 A1 Apr. 21, 2005

Related U.S. Application Data

(63) Continuation of application No. PCT/DE03/00370, filed on Feb. 7, 2003.

(30) Foreign Application Priority Data
Feb. 22, 2002 (DE) ............... 102 07 544

(51) Int. Cl.
H03D 3/24 (2006.01)
H04L 27/00 (2006.01)
(52) U.S. Cl. .................... 375/376; 375/295
(58) Field of Classification Search ........... 375/316, 375/326, 371, 373, 374, 376, 354, 295; 327/141, 327/147, 148, 156, 157–159
See application file for complete search history.

(56) References Cited

U.S. PATENT DOCUMENTS

| 5,207,491 | A | 5/1993 | Rottinghaus ............ 331/16 |
| 6,229,400 | B1 | 5/2001 | McCollough et al. ...... 331/17 |
| 6,515,553 | B1* | 2/2003 | Filiol et al. ............ 332/127 |
| 6,933,798 | B2* | 8/2005 | Hammes et al. ......... 332/127 |
| 2005/0046488 | A1* | 3/2005 | Grewing et al. .......... 331/23 |

FOREIGN PATENT DOCUMENTS

| DE | 199 29 167 A1 | 12/2000 |
| EP | 0 961 412 A1 | 12/1999 |
| GB | 2 337 884 A | 12/1999 |
| GB | 2 354 649 A | 3/2001 |
| WO | WO 99/07065 | 2/1999 |

OTHER PUBLICATIONS

Neuraiter et al., "GSM 900/DCS 18000 Fractional-N Modulator with Two-Point-Modulation," IEEE, 2002, pp. 425-428.*
Durdodt et al., "A Low-IF RX Two Point Modulation TX CMOS Single Chip Bluetooth Solution," IEEE, 2001, pp. 1531-1537. to.*

* cited by examiner

*Primary Examiner*—Tesfladet Bocure
(74) *Attorney, Agent, or Firm*—Dicke, Billig & Czaja, PLLC

(57) ABSTRACT

A PLL circuit (1) is regulated by means of a digital modulation signal (28) at a first frequency, and is then regulated at a second frequency, by deactivation of the digital modulation signal (28). A difference signal (32), which is characteristic of the voltage change in a control signal (22) for the VCO (7) which is produced by deactivation of the digital modulation signal (28) is compared with an analog modulation signal (34). The analog modulation signal (34) is changed so as to correct any discrepancy determined during the comparison.

15 Claims, 2 Drawing Sheets

US 7,349,516 B2

METHOD FOR TRIMMING A TWO-POINT MODULATOR, AND A TWO-POINT MODULATOR HAVING A TRIMMING APPARATUS

CROSS-REFERENCE TO RELATED APPLICATION

This application is a continuation of copending International Application No. PCT/DE03/00370 filed Feb. 7, 2003 which designates the United States, and claims priority to German application no. 102 07 544.1 filed Feb. 22, 2002.

TECHNICAL FIELD OF THE INVENTION

The invention relates to a method for trimming a two-point modulator which is based on a PLL circuit. The invention also relates to a two-point modulator having a trimming apparatus.

BACKGROUND OF THE INVENTION

A simple implementation of a transmitter concept for transceivers in mobile radio systems is offered by transmitters which have a modulator that operates on the known principle of two-point modulation. A PLL (phase locked loop) circuit is in this case used as a frequency synthesizer, and is used for phase modulation or frequency modulation of a radio-frequency signal.

The modulation signals are normally injected at two points in the PLL circuit. Firstly, a programmable frequency divider in the PLL circuit is driven by a digital modulation signal. The programmable frequency divider is arranged in the feedback path of the PLL circuit and represents a point in the PLL circuit which has a low-pass transmission response for the injection of modulation. The digital modulation signal may in this case have a wider bandwidth than the low-pass filter that is formed by the PLL circuit. Secondly, an analog modulation signal is injected into a summation point which is located in the forward path of the PLL circuit and is preferably connected upstream of the voltage controlled oscillator. The analog modulation which is fed in at the summation point has a high-pass filtering effect, by means of the closed control loop, on the output of the PLL circuit, so that the corresponding modulation signal is in turn corrupted by the transmission response. The digital modulation signal and the analog modulation signal are superimposed at the output of the PLL circuit, and this results in the PLL circuit having a transmission response which is independent of frequency. The simultaneous injection of a digital modulation signal and an analog modulation signal into a PLL circuit is referred to as two-point modulation.

A two-point modulator such as this and a method for phase modulation or frequency modulation using a PLL circuit is described in German Laid-Open Specification DE 199 29 167 A1. A digital modulation signal is fed into the control connection of a frequency divider in the feedback path of the PLL circuit, thus resulting in the determination of the number by whose reciprocal the instantaneous frequency of the input signal to the frequency divider is multiplied. Furthermore, the digital modulation signal is converted by means of a digital/analog converter to an analog modulation signal, which is injected into the PLL circuit at a summation point which represents a high-pass filter point.

In the described type of transmitter concept, the control loop remains closed. In order to achieve a low noise level in the PLL circuit, the bandwidth of the PLL circuit is designed to be considerably narrower than would be necessary for transmission of the modulated data. In order to compensate for the narrow bandwidth, the analog modulation signal is injected into the PLL circuit, as well as the digital modulation signal.

The essential feature for the method of operation of two-point modulation is that the digital modulation signal and the analog modulation signal have amplitudes which match well, in addition to being in phase. However, the production tolerances in the components which are required for analog modulation result in fluctuations in the modulation gradient and in the amplitude level of the analog modulation signal. For this reason, after production of the PLL circuit, amplitude trimming must be carried out between the analog modulation signal and the digital modulation signal.

If temperature influences are also intended to be taken into account, such trimming must be carried out before each transmission process.

One known method for trimming a PLL circuit with two-point modulation is to apply the two-point modulation to the circuit in the steady state, and to receive and to demodulate the transmitted signal using an external measurement receiver. The digital and analog modulation signals are trimmed as a function of the demodulation result that it is obtained. Owing to the non-linear frequency response of the oscillation-generating element of the PLL circuit—a voltage controlled oscillator (VCO—as a function of the control voltage, this trimming process must, however, be carried out for each channel. This results in a correspondingly long measurement time when there are a relatively large number of channels. In addition, the trimming information must be stored in a memory. A further disadvantage of this method is that the influence of temperature changes is ignored in this method.

A further known method for trimming a PLL circuit with two-point modulation is essentially based on the method described above. However, in this case, the reception and the demodulation of the signal that is produced by the PLL circuit are carried out by the receiving section in the transceiver. However, this involves considerably more circuit complexity, since a second PLL circuit is required in the receiver in order to carry out this method.

SUMMARY OF THE INVENTION

The object of the invention is thus to specify a trimming method for a two-point modulator which is based on a PLL circuit, by means of which quick, accurate and low-cost amplitude trimming can be achieved between the digital modulation signal and the analog modulation signal. A further aim is to provide a two-point modulator having a PLL circuit and a trimming apparatus, by means of which the amplitudes of the modulation signals can be trimmed quickly and accurately, with relatively little circuit complexity.

The object on which the invention is based can be achieved by a trimming method for a PLL circuit which operates on the principle of two-point modulation, comprising the following steps, which are carried out in the stated sequence:

(a) injecting a digital modulation signal into the PLL circuit, with the PLL circuit regulating at a first frequency;

(b) deactivating the digital modulation signal, with the PLL circuit regulating at a second frequency, which is not the same as the first frequency;

(c) outputting a difference signal, which corresponds to the change in a control signal, which is produced by the deactivation of the digital modulation signal, for a frequency-generating unit in the PLL circuit;

(d) comparing the difference signal with a comparison signal, which is characteristic of a modulation shift of an analog modulation signal; and (e) changing the modulation shift such that any discrepancy between the difference signal and the comparison signal which is determined during the comparison is corrected.

The injection of the digital modulation signal may result in the PLL circuit being regulated at a first frequency, which is formed by the subtraction of a frequency of a variably selectable, digital modulation shift from a channel mid-frequency. The deactivation of the digital modulation signal may result in the PLL circuit being regulated at a second frequency, which is the same as the channel mid-frequency. A main path in the PLL circuit can be connected in parallel with a trimming path which contributes to control signal generation, comprising the following step of activating the trimming path at least during the deactivated state of the digital modulation signal. The main path in the PLL circuit may have a narrower frequency bandwidth than the trimming path, and in particular, the second frequency can be outside the frequency bandwidth of the main path, and can be within the frequency bandwidth of the trimming path. The main path may have a first loop filter with a first loop filter bandwidth, and the trimming path may have a second loop filter with a second loop filter bandwidth, with the first loop filter bandwidth being narrower than the second loop filter bandwidth. The trimming path can be deactivated in step (a), and a modulation input of a voltage-controlled oscillator can be precharged to a reference voltage, wherein the modulation input is fed from the trimming path. The digital modulation signal can be injected via a frequency divider which is arranged in the feedback path of the PLL circuit. A control input of the frequency divider can be fed by a sigma-delta modulator, and the channel mid-frequency can be selected such that the quotient of the channel mid-frequency divided by the frequency of a reference signal which is used for driving the voltage controlled oscillator is essentially an integer.

The object can also be achieved by a PLL circuit which is designed for injection of an analog modulation signal and of a digital modulation signal on the basis of the two-point modulation principle, wherein a main path in the PLL circuit is connected in parallel with a trimming path, wherein the trimming path comprises an output means for production of a difference signal which is characteristic of the change in a control signal for a frequency-generating unit in the PLL circuit when different digital modulation signals are injected into the PLL circuit, a comparison unit for comparison of the difference signal with a comparison signal which is characteristic of a modulation shift of an analog modulation signal, and a modulation unit, which changes the modulation shift of the analog modulation signal as a function of an output signal from the comparison unit.

The main path in the PLL circuit may have a first charge pump and a first loop filter, which is connected downstream from the first charge pump. The output means may have a second charge pump and a second loop filter, which is connected downstream from the second charge pump. The main path in the PLL circuit may have a narrower frequency bandwidth than the trimming path, and in particular, the loop filter bandwidth of the first loop filter may be narrower than the loop filter bandwidth of the second loop filter. The PLL circuit may comprise a first switch, via which the difference signal can be applied to a modulation input of a voltage controlled oscillator in the PLL circuit and may also comprise a second switch, in whose closed position the comparison signal is applied to an input of the comparison unit.

In a trimming method according to the invention for a PLL circuit which operates on the principle of two-point modulation, the PLL circuit is regulated at a first frequency by injection of a digital modulation signal. The digital modulation signal is then deactivated, that is to say it is set to the value zero, as a result of which the PLL circuit regulates at a second frequency, which is not the same as the first frequency. A difference signal, which is characteristic of a change in a control signal for a frequency-generating unit in the PLL circuit, with the change being produced by deactivation of the digital modulation signal, is produced and is output from the PLL circuit. The difference signal is compared with a comparison signal, which is characteristic of a modulation shift of an analog modulation signal, and the modulation shift of the analog modulation signal is changed as a function of the discrepancy determined in the comparison, such that the discrepancy is corrected.

The trimming method according to the invention has the advantage that there is no need to demodulate the output signal which is produced by the PLL circuit for trimming purposes. Furthermore, the circuit complexity for carrying out the trimming method according to the invention is relatively low. In consequence, overall, this results in a quick and accurate trimming method for a two-point modulator which, furthermore, can be carried out cost-effectively.

According to one advantageous refinement of the invention, the digital modulation signal is injected into the PLL circuit such that the PLL circuit regulates at a first frequency, which is formed by subtraction of a frequency of a variably selectable, digital modulation shift from a channel mid-frequency. The PLL circuit is preferably regulated at a second frequency, which is the same as the channel mid-frequency by deactivation of the digital modulation signal.

One preferred refinement of the invention provides for a main path in the PLL circuit to be connected in parallel with a trimming path which contributes to control signal generation. In this case, one advantageous method variant is characterized in that the trimming path is activated at least during the deactivated state of the digital modulation signal.

Furthermore, it is possible to provide for the main path in the PLL circuit to be deactivated during the deactivated state of the digital modulation signal by, for example, setting a current which is produced by a charge pump (which is located in the main path) to the value zero. This means that a voltage which corresponds to the digital modulation signal at a tuning input of a voltage controlled oscillator remains essentially constant during the subsequent steps. However, as an alternative to the described measure, it is considerably more advantageous for the main path in the PLL circuit to have a narrower frequency bandwidth than the trimming path. If, furthermore, the second frequency is within the frequency bandwidth of the trimming path but outside the frequency bandwidth of the main path, the main path cannot follow this modulation change after the deactivation of the digital modulation signal, so that this results in an essentially constant voltage being applied to the tuning input of the voltage controlled oscillator.

This measure as described above may, for example, be carried out by the main path and the trimming path each containing a loop filter, with the loop filter bandwidth of the loop filter which is arranged in the main path being narrower than that of the loop filter which is arranged in the trimming path.

However, in general, the maintenance of the voltage which is produced at the tuning input of the voltage controlled oscillator when the digital modulation signal is initially injected can be achieved in a different way. A further possible way to achieve this is to keep the main path in the PLL circuit active after the injection of the digital modulation signal, and to select a current by means of the charge pump in the main path of the PLL circuit such that the voltage at the tuning input of the voltage controlled oscillator is kept essentially constant. This makes it possible to prevent any change in the voltage at the tuning input of the voltage controlled oscillator as a result of leakage currents in the main path, during the trimming process.

Furthermore, it is advantageous for the trimming path to be deactivated in step (a) of the method according to the invention and for a modulation input (which is fed from the trimming path) of a voltage controlled oscillator to be precharged to a reference voltage of, for example, 0 volts.

Furthermore, the digital modulation signal is preferably injected into the PLL circuit via a frequency divider which is arranged in the feedback path of the PLL circuit. A control connection of the frequency divider is used as the input for the digital modulation signal. A sigma-delta modulator can advantageously be connected upstream of this control input. In this case, it is particularly advantageous to select the channel mid-frequency such that the quotient of the channel mid-frequency divided by the frequency of a reference signal which is used for driving the voltage controlled oscillator is essentially an integer. This has the advantage that quantization noise, which is caused by the sigma-delta modulator and could lead to an erroneous trimming process if the loop filter bandwidth of the loop filter that is arranged in the trimming path is wide, cannot occur in the PLL control loop.

A further aspect of the invention relates to a PLL circuit which is designed for injection of an analog modulation signal and of a digital modulation signal based on the principle of two-point modulation. A main path in the PLL circuit is connected in parallel with a trimming path which has an output means for production of a difference signal. The difference signal is characteristic of the change in a control signal for a frequency-generating unit for injection of different digital modulation signals into the PLL circuit. Furthermore, the trimming path has a comparison unit for comparison of the difference signal with a comparison signal which is characteristic of a modulation shift of an analog modulation signal, and a modulation unit, which changes the modulation shift of the analog modulation signal as a function of an output signal from the comparison unit.

The PLL circuit according to the invention together with the main path and the trimming path which is connected in parallel with it results in a relatively simple and low-complexity circuit design, which makes it possible to trim the digital modulation signal and the analog modulation signal quickly and accurately.

A first charge pump and a first loop filter, which is connected downstream from the first charge pump, are preferably arranged in the main path in the PLL circuit. Analogously to this, a second charge pump and a second loop filter, which is connected downstream from the second charge pump, are preferably located in the trimming path.

One particularly advantageous refinement of the invention provides for the main path in the PLL circuit to have a narrower frequency bandwidth than the trimming path. As has already been explained above, this measure is advantageous in order to close the PLL control loop via the trimming path when a corresponding change occurs in the digital modulation signal. This can be achieved in particular by the loop filter bandwidth of the first loop filter being narrower than that of the second loop filter.

A further advantageous refinement of the invention provides for the capability for the difference signal to be applied via a first switch to a modulation input of a voltage controlled oscillator in the PLL circuit. It is also advantageously possible to provide for the trimming path to have a second switch, in whose closed position the comparison signal is applied to an input of the comparison unit.

BRIEF DESCRIPTION OF THE DRAWING

The invention will be explained in more detail in the following text using exemplary embodiments and with reference to the drawings, in which.

DESCRIPTION OF THE INVENTION

Figure 1:
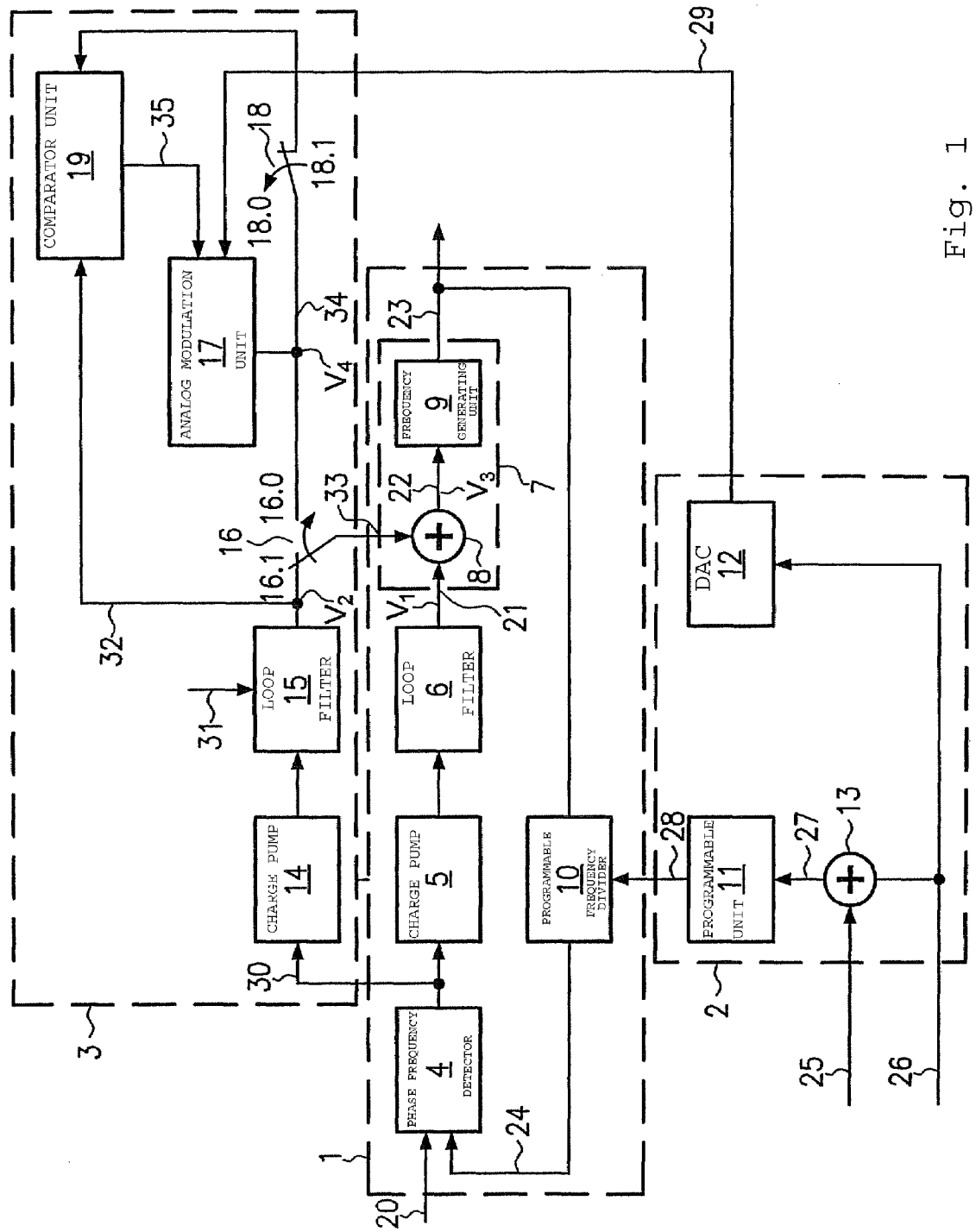
FIG. 1 shows a schematic circuit diagram of one exemplary embodiment of the PLL circuit according to the invention, which operates on the principle of two-point modulation.

FIG. 1 shows, schematically, a circuit diagram of one exemplary embodiment of the two-point modulator according to the invention. The present two-point modulator has a PLL circuit 1, a modulation apparatus 2 and a trimming apparatus 3.

In its main path, the PLL circuit 1 has a phase frequency detector 4, a charge pump 5, a loop filter 6 and a voltage controlled oscillator (VCO) 7. The loop filter 6 is in the form of a low-pass filter, which smooths higher-frequency signal components. The voltage controlled oscillator 7 represents the oscillation-generating component in the PLL circuit 1 and has a summation point 8 and a frequency-generating unit 9. The PLL circuit 1 is closed via a feedback path which extends from the output of the voltage controlled oscillator 7 to an input of the phase frequency detector 4, and in which a programmable frequency divider 10 is arranged. The programmable frequency divider 10 may, for example, be in the form of a fractional N frequency divider, thus also allowing frequency division by a number that is not an integer.

In order to produce a digital modulation signal 28, the modulation apparatus 2 has a programming unit 11 and a digital analog converter 12.

A trimming path for the trimming apparatus 3 is connected in parallel with the main path in the PLL circuit 1. The trimming path has a charge pump 14 and a loop filter 15 which is connected downstream from the charge pump 14. The trimming apparatus 3 also has an analog modulation unit 17 and a comparator unit 19. One input of the comparator unit 19 is coupled to the output of the loop filter 15. Either the loop filter 15 or the analog modulation unit 17 is electrically connected via a switch 16 to a modulation input 33 of the voltage controlled oscillator 7 in the PLL circuit 1, depending on the operating mode. The output of the analog modulation unit 17 can be fed back to a further input of the comparator unit 19 via a switch 18. The output of the comparator unit 19 is connected to a control input of the analog modulation unit 17.

In the case of two-point modulation, an analog modulation signal and a digital modulation signal are injected into the PLL circuit 1 via the modulation apparatus 2. Since, unlike the digital modulation signal which has no tolerances owing to its discrete nature, the analog modulation signal is subject to drift and tolerances, the amplitudes of the two modulation signals must be matched to one another.

The modulation signal 26 which, in the present exemplary embodiment, is in the form of a digital signal, is added at a summation point 13 to a carrier signal 25 which is used as the basis for the PLL frequency synthesis. The resultant signal 27 is applied to one input of the programming unit 11.

The programming unit 11 which, in the exemplary embodiment, is in the form of a sigma-delta modulator, produces at its output a digital modulation signal 28, which is applied to a control connection of the programmable frequency divider 10. The digital modulation signal 28 in this case indicates the summand $\Delta N$ of a division ratio of $1/(N+\Delta N)$ with the summand N being permanently set, by way of example, and the term $(N+\Delta N)$ representing an integer. The modulation signal 26 is thus injected into the feedback path of the PLL circuit 1 via the programmable frequency divider 10 with a (variable) frequency division ratio which is determined by the modulation. A frequency divider signal 24 is produced at the output of the programmable frequency divider 10, and is applied to one input of the phase frequency detector 4.

A reference signal 20 at a reference frequency $f_{ref}$ is applied to a further input of the phase frequency detector 4. The reference frequency $f_{ref}$ may, for example, be produced by an oscillating crystal, which is not illustrated in FIG. 1. A difference signal 30, which reflects the frequency and/or phase difference between the reference signal 20 and the frequency divider signal 24, is thus produced at the output of the phase frequency detector 4. The difference signal 30 from the phase frequency detector 4 is used to drive the charge pump 5. A current whose magnitude depends on the difference signal 30 is produced in the charge pump 5. The loop filter 6 is charged with the current that is produced in the charge pump 5. The output signal from the loop filter 6 is a voltage signal, and is applied to a tuning input 21 of the voltage controlled oscillator 7. An output signal 23 which is produced at the output of the voltage controlled oscillator 7 is not only the feedback signal for the PLL circuit 1, which feeds the input of the programmable frequency divider 10, but is also the output signal from the present two-point modulator and from the PLL circuit 1.

Figure 2:
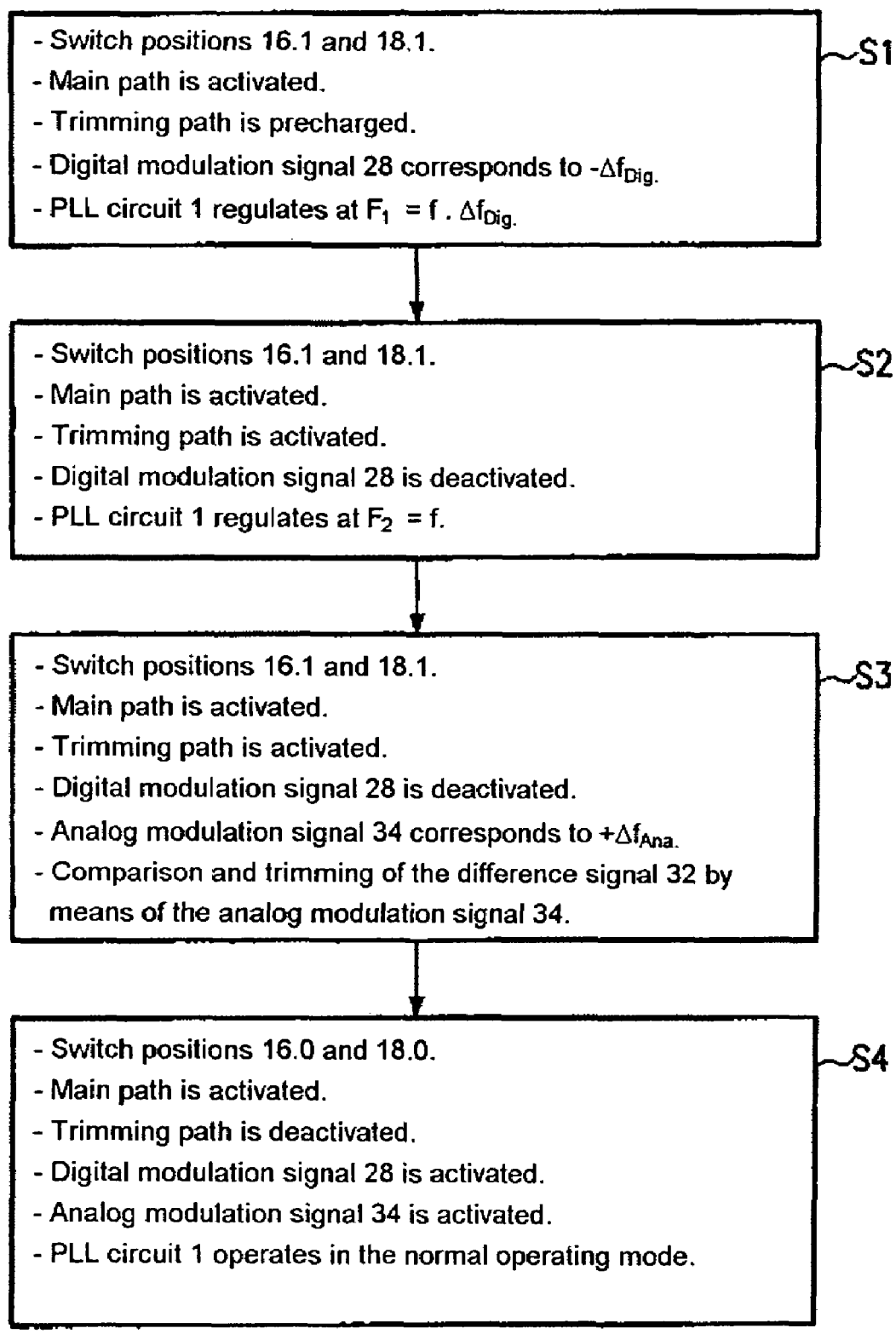
FIG. 2 shows a schematic flowchart of one exemplary embodiment of the trimming method according to the invention.

One exemplary embodiment of the trimming method according to the invention will be explained in the following text, by way of example, with reference to the two-point modulator which is illustrated in FIG. 1. This exemplary embodiment is illustrated schematically in the form of a flowchart in FIG. 2.

In a first step S1, the switch 16 connects the output of the loop filter 15 to the modulation input 33 of the voltage controlled oscillator 7. This switch position of the switch 16 is referred to in the following text and in FIG. 1 as 16.1. The other switch position of the switch 16 is referred to as 16.0. The switch 18 is closed during the step S1. The closed switch position of the switch 18 is referred to as 18.1, while its open switch position is referred to as 18.0. The digital modulation signal 28 is input into the programmable frequency divider 10 with a constant division ratio. The division ratio in this case is such that the PLL circuit 1 regulates at a frequency $F_1$ which corresponds to a channel mid-frequency f minus a digital modulation shift $\Delta f_{Dig}$.

Since the PLL circuit 1 is regulated at the frequency $F_1 = f - \Delta f_{Dig}$, a voltage value $V_1$ which corresponds to the frequency $F_1$ is produced at the tuning input 21 of the voltage controlled oscillator 7. For example, if the voltage controlled oscillator 7 has a linear frequency/voltage characteristic, the voltage value $V_1$ is proportional to the frequency $F_1$.

During the process in which the PLL circuit 1 is regulating itself at the frequency $F_1$, the trimming path in the trimming apparatus 3 is deactivated. During this period, the loop filter 15 is precharged by means of a charging signal 31 to the fixed voltage value of zero. The modulation input 33 of the voltage controlled oscillator 7 is thus likewise precharged to a fixed voltage value.

Once the process of the PLL circuit 1 regulating itself at the frequency $F_1$ has been completed, the digital modulation signal 28 is set to the value zero in a second step S2. In this case, the switches 16 and 18 remain in the switch positions 16.1 and 18.1, without any change. The trimming path is now activated. In consequence, the PLL circuit 1 is regulated at a frequency $F_2$. The bandwidth of the loop filter 15 in the present case is designed to be considerably wider than that of the loop filter 6. Owing to the narrow bandwidth of the main path in the PLL circuit 1, which is formed by the charge pump 5 and the loop filter 6, the main path cannot follow the change in the digital modulation signal 28, so that the voltage at the tuning input 21 of the voltage controlled oscillator 7 remains essentially constant.

The control loop for the PLL circuit 1 is thus closed for the duration of the trimming process via the trimming path, that is to say via the charge pump 14, the loop filter 15 and the modulation input 33 of the voltage controlled oscillator 7.

The PLL circuit frequency $F_2$ which is produced by the deactivation of the digital modulation signal 28 is equal to the channel mid-frequency f. The voltage value $V_1$ is still applied to the tuning input 21 of the voltage controlled oscillator 7. A voltage value $V_2$ which corresponds to the digital modulation shift $\Delta f_{Dig}$ is produced at the modulation input 33 of the voltage controlled oscillator 7.

This voltage value $V_2$ results from the fact that the output frequency of the voltage controlled oscillator 7 corresponds to the second frequency $F_2$ at which the PLL circuit 1 is regulated. A control signal 22, whose voltage $V_3$ produces the frequency $F_2$, is thus applied to the frequency-generating unit 9. The summation condition at the summation point 8 as well as the constant voltage $V_1$ at the tuning input 21 of the voltage controlled oscillator 7 thus results in a difference signal 32 with a voltage value $V_2(\Delta f_{Dig}) = V_3(f) - V_1(f - \Delta f_{Dig})$ at the modulation input 33 of the voltage controlled oscillator 7.

Since, in the present exemplary embodiment, the programming unit 11 is in the form of a sigma-delta modulator, the channel mid-frequency f is chosen such that the quotient $f/f_{ref}$ is an integer. This setting is advantageous since it results in any quantization noise that is caused by the sigma-delta modulator being suppressed, which could lead to an error in the rest of the trimming process owing to the wide bandwidth of the loop filter 15.

The aim of a third step S3 is to compare the different signal 32 which can be tapped off at the output of the loop filter 15 with an analog modulation signal 34. The switches 16 an 18 in this case still remain in the switch positions 16.1 and 18.1, without any change. The digital signal 26 is converted by the digital/analog converter 12 to an analog modulation signal 29, and is applied to one input of the analog modulation unit 17. The analog modulation unit 17 produces an analog modulation signal 34. The analog modulation signal 34 is intended to produce a frequency $F_3=f+\Delta f_{Ana}$, which is formed from the sum of the channel mid-frequency f and an analog modulation shift $\Delta f_{Ana}$, at the output of the voltage controlled oscillator 7 when the switches 16 and 18 are in appropriate switch positions. The voltage value $V_4$ which corresponds to this frequency $F_3$ at the modulation input 33 must be of precisely the same magnitude as the voltage value $V_2$ in the trimmed state. In order to carry out the comparison with the voltage value $V_2$, the analog modulation signal 34 is applied to one input of the comparator unit 19. The voltage value $V_2$ of the difference signal 32 is applied to a further input of the comparator unit 19.

Any discrepancy which is determined in the comparator unit 19 between the voltage value $V_2$ of the difference signal 32 and the voltage value $V_4$ of the analog modulation signal 34 is corrected by varying the analog modulation shift $\Delta f_{Ana}$ of the analog modulation signal 34 which is produced at the output of the analog modulation unit 17. For this purpose, the discrepancy which is determined in the comparator unit 19 is supplied by means of an output signal 35 to the analog modulation unit 17.

Alternatively, the voltage $V_2$ which corresponds to the difference signal 32 can be stored at the input of the comparator unit 19, for example by means of a capacitor, and can then be compared with the voltage value $V_4$ of the analog modulation signal 34. As soon as the difference between the voltage values $V_2$ and $V_4$ has been corrected, matching is achieved between the digital modulation shift $\Delta f_{Dig}$ and the analog modulation shift $\Delta f_{Ana}$.

In a fourth step S4, after the completion of the trimming process, the switches 16 and 18 are switched to the switch positions 16.0 and 18.0, and the charge pump 14 as well as the loop filter 15 are deactivated. The PLL circuit 1 is thus closed via the main path.

The PLL circuit 1 is now trimmed for two-point modulation, and can resume its operation. The digital modulation signal 28 and the analog modulation signal 34 are in this case superimposed, and the described trimming process results in the PLL circuit 1 having a transmission response which is independent of frequency.

If an analog modulation signal is used instead of the digital modulation signal 26, the modulation apparatus 2 may, for example, also be designed such that there is no need for the digital/analog converter 12 and, instead of this, an appropriate signal conversion is carried out in the digital modulation path.

The trimming of the signals which are applied to the comparator unit 19 may be carried out, for example, using an iterative process. In this case, the modulation amplitudes are trimmed approximately with alternate updating of the analog modulation signal 34 and assessment of the changed output signal 35 from the comparator unit 19 which is then obtained. Once the voltage difference at the comparator unit 19 has been corrected, the trimming between the digital modulation shift $\Delta f_{Dig}$ and the analog modulation shift $\Delta f_{Ana}$ has been achieved.

The invention claimed is:

1. A trimming method for a PLL circuit which operates on the principle of two-point modulation, comprising the following steps, which are carried out in the stated sequence:
    (a) injecting a digital modulation signal into the PLL circuit, with the PLL circuit regulating at a first frequency;
    (b) deactivating the digital modulation signal, with the PLL circuit regulating at a second frequency, which is not the same as the first frequency;
    (c) outputting a difference signal, which corresponds to the change in a control signal, which is produced by the deactivation of the digital modulation signal, for a frequency-generating unit in the PLL circuit;
    (d) comparing the difference signal with a comparison signal, which is characteristic of a modulation shift of an analog modulation signal; and
    (e) changing the modulation shift such that any discrepancy between the difference signal and the comparison signal which is determined during the comparison is corrected.

2. The method as claimed in claim 1, wherein
the injection of the digital modulation signal results in the PLL circuit being regulated at a first frequency, which is formed by the subtraction of a frequency of a variably selectable, digital modulation shift from a channel mid-frequency.

3. The method as claimed in claim 1, wherein
the deactivation of the digital modulation signal results in the PLL circuit being regulated at a second frequency, which is the same as the channel mid-frequency.

4. The method as claimed in claim 1, wherein
a main path in the PLL circuit is connected in parallel with a trimming path which contributes to control signal generation, comprising the following step:
activating the trimming path at least during the deactivation state of the digital modulation signal.

5. The method as claimed in claim 4, wherein
the main path in the PLL circuit has a narrower frequency bandwidth than the trimming path, and
in particular, the second frequency is outside the frequency bandwidth of the main path, and is within the frequency bandwidth of the trimming path.

6. The method as claimed in claim 5, wherein
the main path has a first loop filter with a first loop filter bandwidth, and
the trimming path has a second loop filter with a second loop filter bandwidth, with the first loop filter bandwidth being narrower than the second loop filter bandwidth.

7. The method as claimed in claim 4, wherein
the trimming path is deactivated in step (a), and a modulation input of a voltage-controlled oscillator is precharged to a reference voltage, wherein the modulation input is fed from the trimming path.

8. The method as claimed in claim 1, wherein
the digital modulation signal is injected via a frequency divider which is arranged in the feedback path of the PLL circuit.

9. The method as claimed in claim 8, wherein
a control input of the frequency divider is fed by a sigma-delta modulator, and
the channel mid-frequency is selected such that the quotient of the channel mid-frequency divided by the frequency of a reference signal which is used for driving the voltage controlled oscillator is essentially an integer.

10. A PLL circuit which is designed for injection of an analog modulation signal and of a digital modulation signal on the basis of the two-point modulation principle, wherein a main path in the PLL circuit is connected in parallel with a trimming path, wherein the trimming path comprises:

an output means for production of a difference signal which is characteristic of the change in a control signal for a frequency-generating unit in the PLL circuit when different digital modulation signals are injected into the PLL circuit, a comparison unit for comparison of the difference signal with a comparison signal which is characteristic of a modulation shift of an analog modulation signal, and a modulation unit, which changes the modulation shift of the analog modulation signal as a function of an output signal from the comparison unit.

11. The PLL circuit as claimed in claim 10, wherein the main path in the PLL circuit has a first charge pump and a first loop filter, which is connected downstream from the first charge pump.

12. The PLL circuit as claimed in claim 10, wherein the output means has a second charge pump and a second loop filter, which is connected downstream from the second charge pump.

13. The PLL circuit as claimed in claim 10, wherein the main path in the PLL circuit has a narrower frequency bandwidth than the trimming path, and in particular, the loop filter bandwidth of the first loop is narrower than the loop filter bandwidth of the second loop filter.

14. The PLL circuit as claimed in claim 10, comprising:

a first switch, via which the difference signal can be applied to a modulation input of a voltage controlled oscillator in the PLL circuit.

15. The PLL circuit as claimed in claim 10, comprising a second switch, in whose closed position the comparison signal is applied to an input of the comparison unit.

* * * * *